United States Patent [19]
Gauthier

[11] 4,420,684

[45] Dec. 13, 1983

[54] LARGE-SURFACE FAST PHOTODETECTOR SENSITIVE IN THE 0.8–1.1 μM RANGE

[75] Inventor: André Gauthier, Paris, France

[73] Assignee: Societe Anonyme de Telecommunications, Paris, France

[21] Appl. No.: 271,953

[22] Filed: Jun. 9, 1981

[30] Foreign Application Priority Data

Jun. 13, 1980 [FR] France .................. 80 13187

[51] Int. Cl.³ .............................. H01J 39/12
[52] U.S. Cl. .................. 250/211 J; 250/226; 357/16; 350/1.1
[58] Field of Search ............ 250/211 J, 226, 370; 357/31, 30, 16; 350/1.1

[56] References Cited

U.S. PATENT DOCUMENTS

| | | | |
|---|---|---|---|
| 3,218,204 | 11/1965 | Ruehrwein | 357/16 |
| 3,261,726 | 7/1966 | Ruehrwein | 357/16 |
| 3,364,066 | 1/1968 | Karlson et al. | 350/1.1 |
| 3,996,461 | 12/1976 | Sulzbach et al. | 250/211 J |
| 4,228,349 | 10/1980 | Ettenberg et al. | 250/226 |

*Primary Examiner*—David C. Nelms
*Assistant Examiner*—J. Jon Brophy
*Attorney, Agent, or Firm*—Stevens, Davis, Miller & Mosher

[57] ABSTRACT

The photodetector comprises a silicon substrate with high sensitivity, a diffusion layer defining a PN junction, and a CdTe layer, as filter, placed on the face close to the PN junction, for stopping radiations of wave lengths shorter than 0.8 μm. The photodetector is suitable for detecting radiations of AsGa diodes used in optical telecommunication systems.

1 Claim, 7 Drawing Figures

LARGE-SURFACE FAST PHOTODETECTOR SENSITIVE IN THE 0.8–1.1 μM RANGE

BACKGROUND OF THE INVENTION

The present invention relates to an infrared photodetector sensitive to the wave-lengths in the 0.8 to 1.1 μm range, and having a very short response time.

In the spectral range in question, in the vicinity of 1 μm, several types of photodetectors may be envisaged.

Photodetectors (for example PbS, Tl$_2$S) always have response times greater than a microsecond and cannot be considered as fast detectors. The performances of certain photomultipliers are highly satisfactory. For example, photocathodes of the type InAs$_{0.85}$P$_{0.15}$OCs or Ga$_{1-x}$IN$_x$AsOCs have a highly satisfactory quantum yield in the vicinity of 1 μm and a very short rise time, of the order of a nanosecond. However, they present serious practical drawbacks: they are fragile, complex to produce, they require a high bias potential, this rendering them inconvenient to use and increasing their price.

Finally, in the case of photovoltaic detectors, several materials may be envisaged: Ge, Si, InAs, InSb, Hg$_{1-x}$Cd$_x$Te.

French Pat. No. 1,561,967 in particular discloses a large-surface photovoltaic photodetector, sensitive in the 0.8–1.1 μm range, comprising a substrate made of silicon of resistivity greater than 10$^3$ Ω.cm, a diffusion layer defining a PN junction, a filter placed on the face, close to the junction which is exposed to the radiations in order to stop the radiations of wave length shorter than a predetermined length, and contacts for the application of a bias potential.

More particularly, the detector of the above-mentioned Patent has a maximum sensitivity at around 1.06 μm.

Silicon being sensitive from a wave length of about 0.4 μm, the presence of a predetermined high-pass filter certainly restricts the spectral band of the detector.

Due to the high resistivity of the silicone substrate, the leakage current is indeed weak and substantially constant over a wide bias range. A high inverted bias potential may therefore be applied in order to offset the cut-off wave-length of the silicon and to reduce the junction capacity and consequently the response time.

However, the above-described detector is not suitable for detecting the radiation of the AsGa diodes emitting at 0.95 μm, used in optical telecommunication systems.

It is therefore an object of the present invention to solve such a problem.

SUMMARY OF THE INVENTION

To this end, the invention relates to a large-surface photovoltaic photodetector sensitive in the 0.8–1.1 μm range, comprising a substrate made of silicon of resistivity higher than 10$^3$ Ω.cm, a diffusion layer defining a PN junction, a filter, placed on the face, close to the junction, which is exposed to the radiations in order to stop the radiations of wave length shorter than a predetermined length, and contacts for application of a bias potential, characterized in that the filter is a layer of CdTe integrated in the detector and stopping the radiations of wave-length shorter than 0.8 μm.

Due to the filter of the invention, a very pronounced spectral response centred on 0.95 μm is obtained. The detector is therefore protected from parasitic radiations, the dark current is reduced and consequently the sensitivity of the detector is excellent.

BRIEF DESCRIPTION OF THE DRAWINGS

The invention will be more readily understood on reading the following description with reference to the accompanying drawings, in which.

DESCRIPTION OF A PREFERRED EMBODIMENT OF THE INVENTION

Figure 1A:
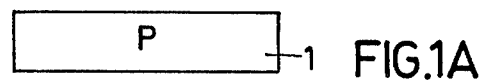
FIGS. 1A, 1B, 1C, 1D, and 1F illustrate the different phases of manufacture of the detector according to the invention.

Referring now to the drawings, the detector according to the invention is manufactured from a silicon monocrystal 1 (FIG. 1A). The silicon is of P type, weakly doped with boron, the effect of the weak doping being a high resistivity of about 10$^4$ Ω.cm.

The monocrystal 1 undergoes a treatment of mechanical and chemical polishing.

Figure 1B:
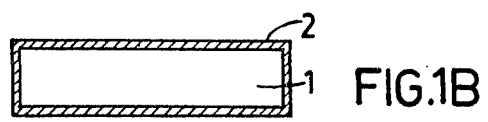

Impurities of N type, phosphorus in the present case, are then diffused. The diffusion layer 2 (FIG. 1B) has a thickness smaller than 1 μm.

Figure 1C:
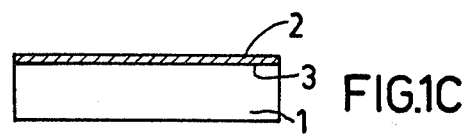

The face intended to receive the radiation is masked and a chemical attack is effected, then the masking layer is removed. A PN junction 3 is thus obtained (FIG. 1C).

Figure 1D:
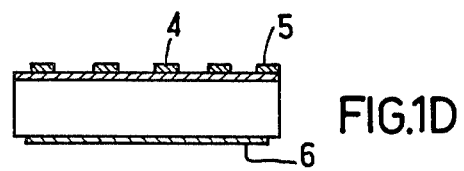

The contacts are then made by evaporation in vacuo for example of titanium and silver (FIG. 1D). The contacts 4 and the end contact 5 of the face exposed to the radiation are in comb form in order to represent the minimum surface, whilst the opposite face bears a continuous contact 6.

The end contact 5 is masked and a layer 7 of CdTe is deposited on the face exposed to radiation (FIG. 1E), said layer 7 having a thickness of between 1 and 10 μm, for example of 5 μm. This deposit is effected by a technique such as thermal evaporation or cathodic sputtering.

A non-reflecting layer 8 of oxide, for example SiO$_2$ or TiO$_2$, is then deposited on the layer of CdTe, in order to reduce the losses by reflection in the useful spectral range, between 0.8 and 1.1 μm, and thus to improve the spectral response.

The mask of the contact 5 is finally removed. The finished detector is shown in FIG. 1F.

When used, an inverted bias potential of $-10$ V is applied. The spectral response of the detector is illustrated in FIG. 2.

Figure 2:
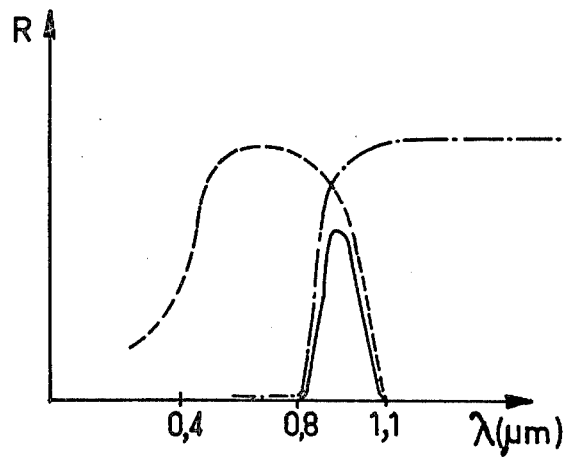
FIG. 2 shows the spectral response of the detector according to the invention.

In FIG. 2, the dashed-line curve represents the spectral response of the silicon detector shown in FIG. 1D, subjected to an inverted bias of $-10$ V. The spectral band is between 0.4 μm and 1.1 μm, i.e. covers all the visible and the near infrared.

The dashed and dotted curve represents the spectral response of CdTe. This material is opaque to the radiations of wave-length shorter than 0.8 μm, and its transparency increases very rapidly from 0.8 to 0.9 μm and reaches its maximum from 1 μm. The CdTe layer thus acts as a high-pass filter whose cut-off value is 0.8 μm.

Figure 1E:
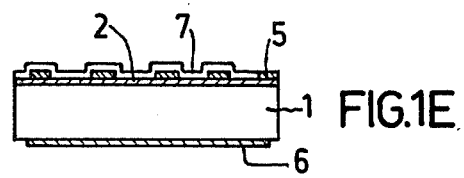
Figure 1F:
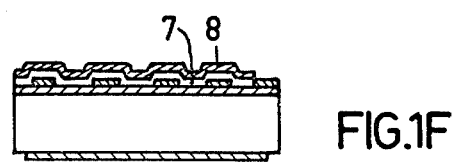

The solid-line curve represents the spectral response of the detector of FIG. 1E provided with the layer of CdTe. This curve results from the product of the two preceding curves and it is observed that the spectral range is between 0.8 and 1.1 μm, with a very pronounced maximum at 0.95 μm.

The detector according to the invention will therefore have an excellent sensitivity with respect to the radiations at 0.95 μm such as those emitted by AsGa diodes.

The characteristics of the detector, in the example described, are as follows:

| | |
|---|---|
| sensitivity surface | 2 cm$^2$ |
| dark current | <0.5 μA |
| responsivity for λ = 0.95 μm | >0.7 A/W |
| response time | <10 ns |

The detector according to the invention has several advantageous properties: large surface, excellent sensitivity for λ=0.95 μm, very short response time and, the material of the substrate being silicon, low cost of the material and easy use, the detector being able to operate at ordinary temperature.

What is claimed is:

1. In a large-surface photovoltaic photodetector, sensitive in the 0.8–1.1 μm range, comprising a substrate made of silicon with resistivity higher than $10^3$ Ω.cm, a diffusion layer having a thickness smaller than 1 μm defining a PN junction, a filter placed on the face exposed to the radiations in order to stop the radiations having a wave-length shorter than a predetermined length, and contacts for application of a bias potential, characterized in that the filter is a layer of CdTe integrated in the detector and stopping the radiations having a wave-length shorter than 0.8 μm.

* * * * *